(12) United States Patent
Tsai et al.

(10) Patent No.: US 6,174,454 B1
(45) Date of Patent: Jan. 16, 2001

(54) SLURRY FORMULATION FOR SELECTIVE CMP OF ORGANIC SPIN-ON-GLASS INSULATING LAYER WITH LOW DIELECTRIC CONSTANT

(75) Inventors: Ming-Shih Tsai, Hsinchu; Shih-Tzung Chang, Feng-Yuan; Bau-Tong Dai, Hsinchu; Ying-Lang Wang, Taichung, all of (TW)

(73) Assignee: National Science Council, Taipei ( * ) Notice: Under 35 U.S.C. 154(b), the term of this patent shall be extended for 0 days.

(21) Appl. No.: 09/239,664

(22) Filed: Jan. 29, 1999

(51) Int. Cl.$^7$ .................................................. C09K 13/06
(52) U.S. Cl. ........................... 252/79.4; 216/89; 438/693
(58) Field of Search .................................. 252/79.1, 79.4, 252/79.5; 438/692, 693, 745, 747; 216/38, 88, 89

(56) References Cited

U.S. PATENT DOCUMENTS 5,855,811 * 1/1999 Grieger et al. .................. 252/79.4 X

* cited by examiner

Primary Examiner—William Powell
(74) Attorney, Agent, or Firm—Pacific Law Group LLP; Chi Ping Chang

(57) ABSTRACT

Slurry formulationf or CMP of organic-added low SOG dielectric was development. The SOG layers with various amount of organic content are subject to polish experiments using silica- and zirconia-based slurries with a variety of additives. The results indicate that, as the amount of organic content in SOG increases, CMP polish rate drops with silica-based KOH-added slurry. On the other hand, zirconia-based slurry could result in higher plish rate for both SOG (>400 nm/min) and thermal oxide. Polish selectivity ranging from 1.2 to 9.1 can be achieved by adding various amount of tetra-alkyl in ammonium hydroxide.

9 Claims, 5 Drawing Sheets

SLURRY FORMULATION FOR SELECTIVE CMP OF ORGANIC SPIN-ON-GLASS INSULATING LAYER WITH LOW DIELECTRIC CONSTANT

FIELD OF THE INVENTION

This invention relates to the field of semiconductor process and, more specifically to slurry formulation for selective CMP of organic spin-on-glass insulating layer with low dielectric constant.

BACKGROUND OF THE INVENTION

Due to the shrinking size and the fast increasing density of the components in semiconductor devices, conduction within a single layer can't fulfil the demands in the nano semiconductor process anymore. Multi-layer conduction is therefore developed. With increasing resolution, the depth of focus in patterning process is reduced, so advanced planarization technique is required. Currently, chemical mechanical planarization (CMP) is the key technique for global planarization.

On the other hand, low dielectric insulating layer is widely used to improve the conduction between components. The RC delay time can be reduced, for example, by adding organic compounds to the traditional insulating layers such as: silica, boron phosphosilicate glass, phosphosilicate glass, borosilicate glass, and florine-added silica.

Traditional silica-based slurry for CMP has low polish rate and is easy to cause scratches on the wafers. Yoshio H., Taeshi F. etc. at Hitachi chemistry use cerium oxide-based slurry instead. The polish rate cerium-based slurry on SOG and thermal oxide is at least five times higher than commercial silica-based slurry CABOT SC-1. They also found that adding organic compounds to silica can not only result in low dielectric constant but also reduce the polish rate of CMP.

So far, no adequate slurry for CMP of organic SOG insulating layer, which can provide satisfying polish rate, is available.

SUMMARY OF THE INVENTION

In accordance with the present invention, slurry formulation for CMP of low dielectric insulating layer. Particularly for organic compound added SOG insulating layer, the polish rate and the polish selectively is enhanced.

When the interconnection between components in the device is completed, a silica layer of 1000 is usually formed. Silica with higher purity and organic compounds is then spinned-on to serve as a layer with low dielectric constant. The polish rate of the slurry in the present invention is much higher when the slurry is applied on organic SOG than thermal oxide. This feature can lead to larger tolerance in end point determination during the planarization process. So the polish time can be controlled more easily. High uniformity and yield is guaranteed.

Other important technical advantages are readily apparent to one skilled in the art from the following figures, descriptions, and claims.

DETAILED DESCRIPTION OF THE INVENTION

Figure 1:
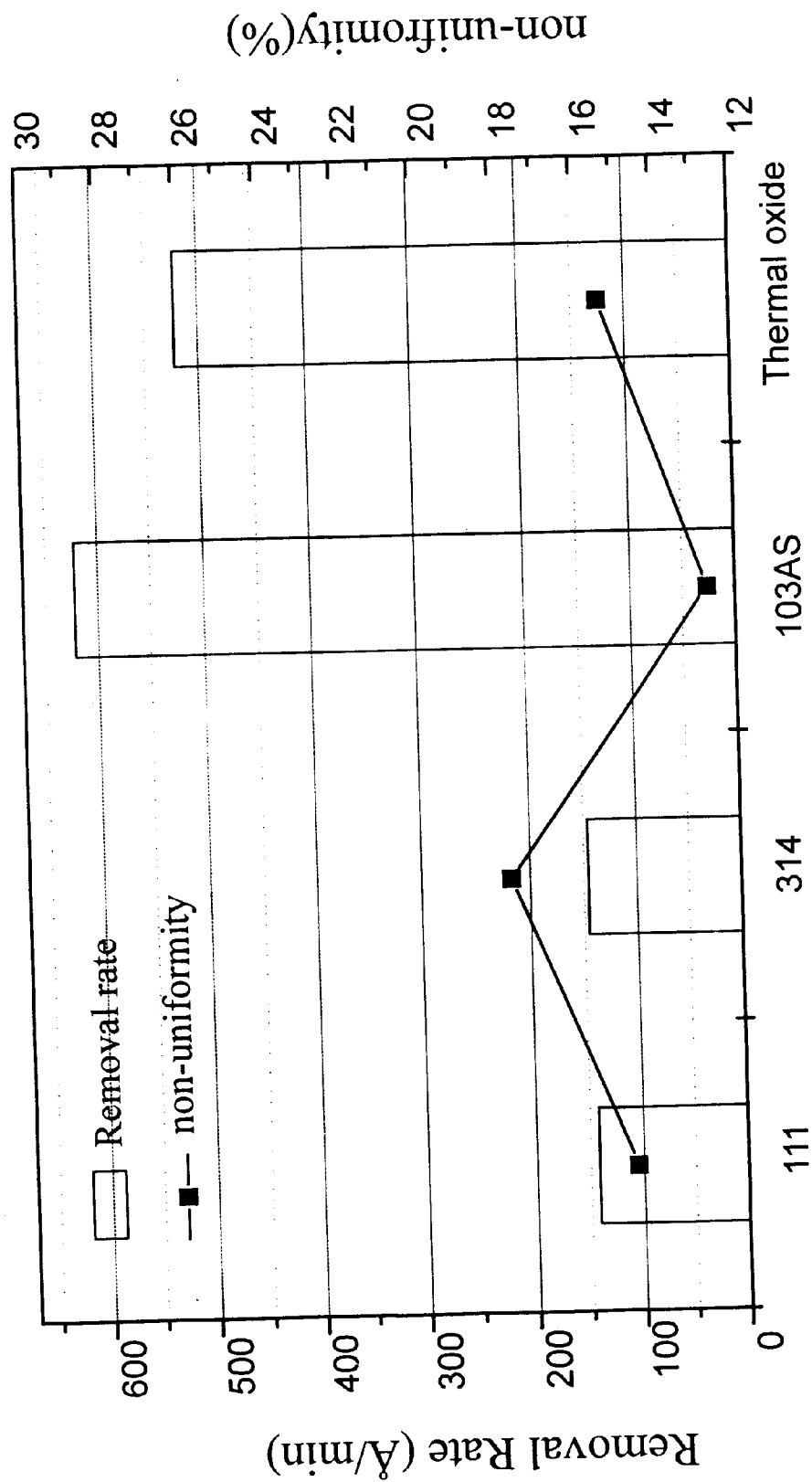
FIG. 1 shown polish rate and non-uniformity of commercial Cabot SC-1 applied on SOG low dielectric insulating layers.
Figure 2:
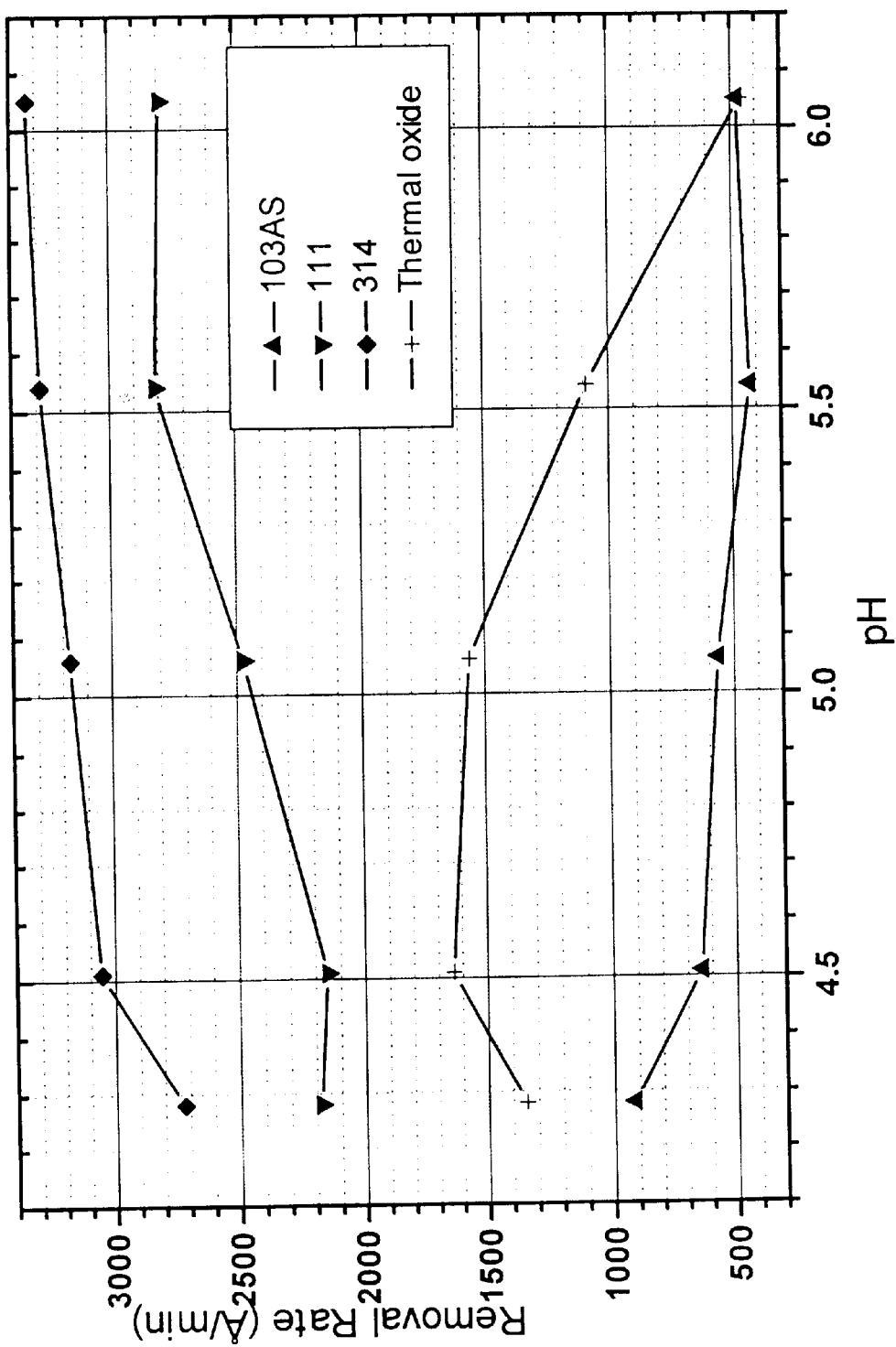
FIG. 2 shown polish rate of zirconium oxide slurry (TMAH) applied on SOG low dielectric insulating layers.
Figure 3:
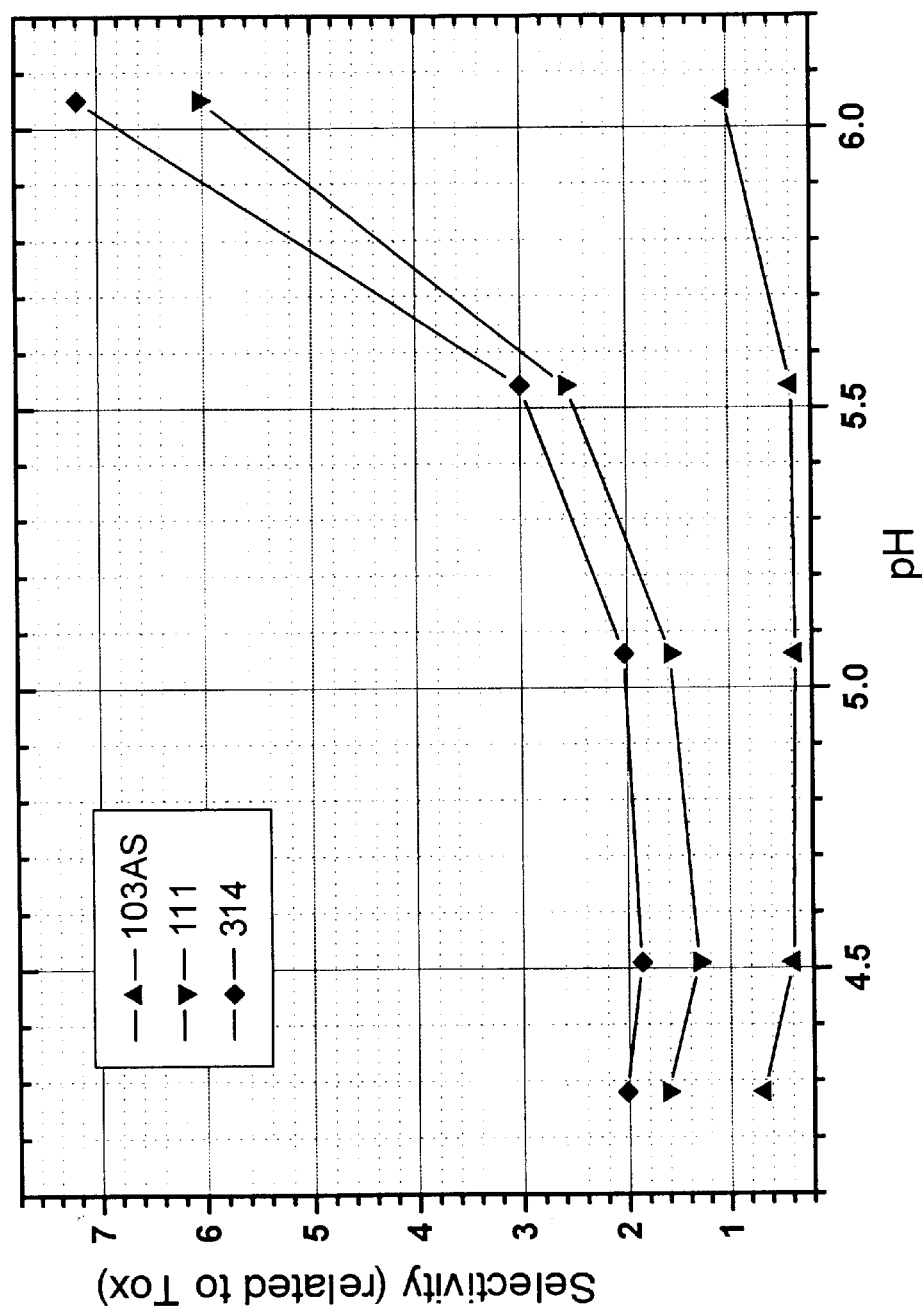
FIG. 3 shown selectivity of zirconium oxide slurry (TMAH) applied on SOG low dielectric insulating layers.
Figure 4:
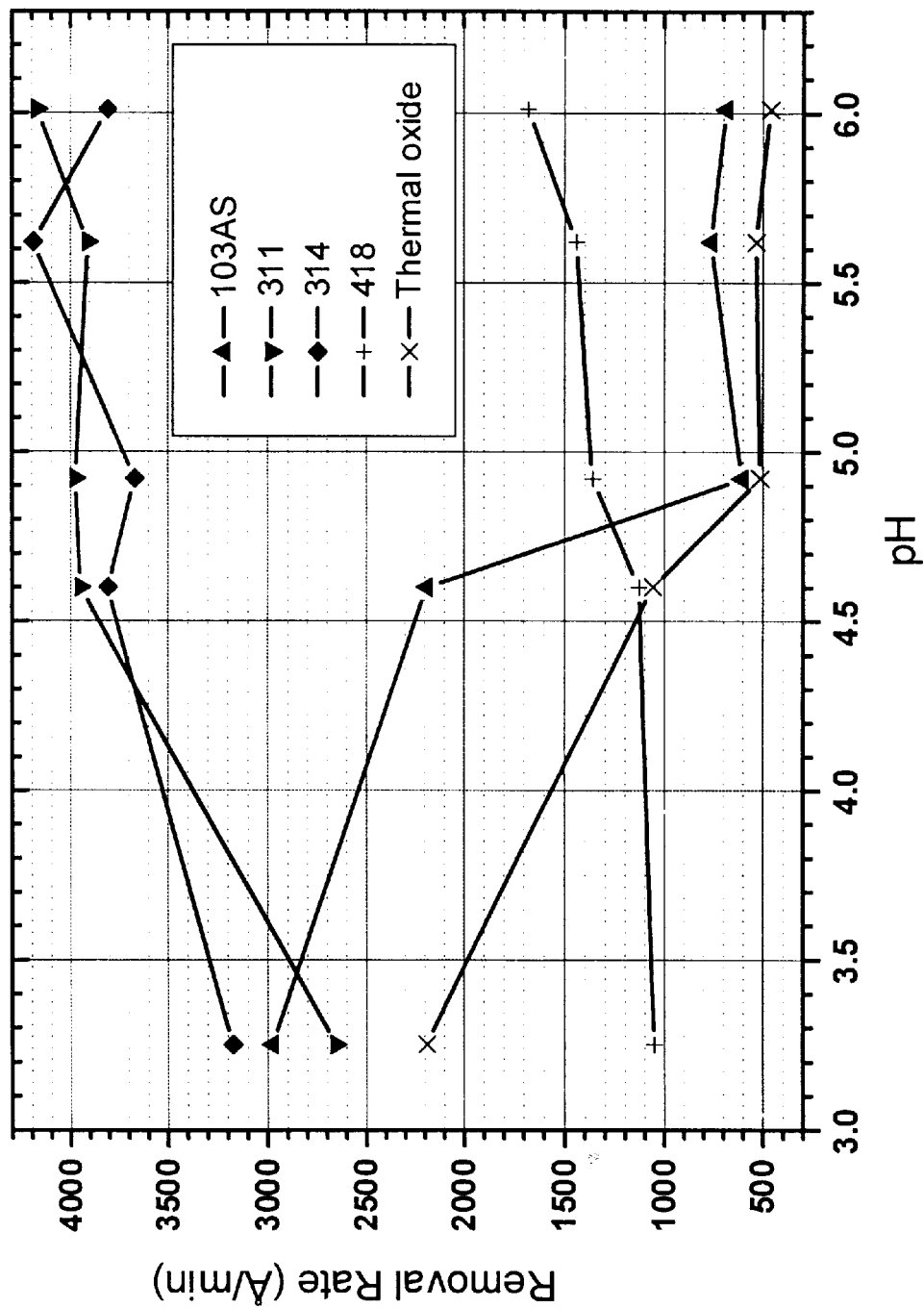
FIG. 4 shown polish rate of zirconium oxide slurry (TMAH) applied on SOG low dielectric insulating layers.
Figure 5:
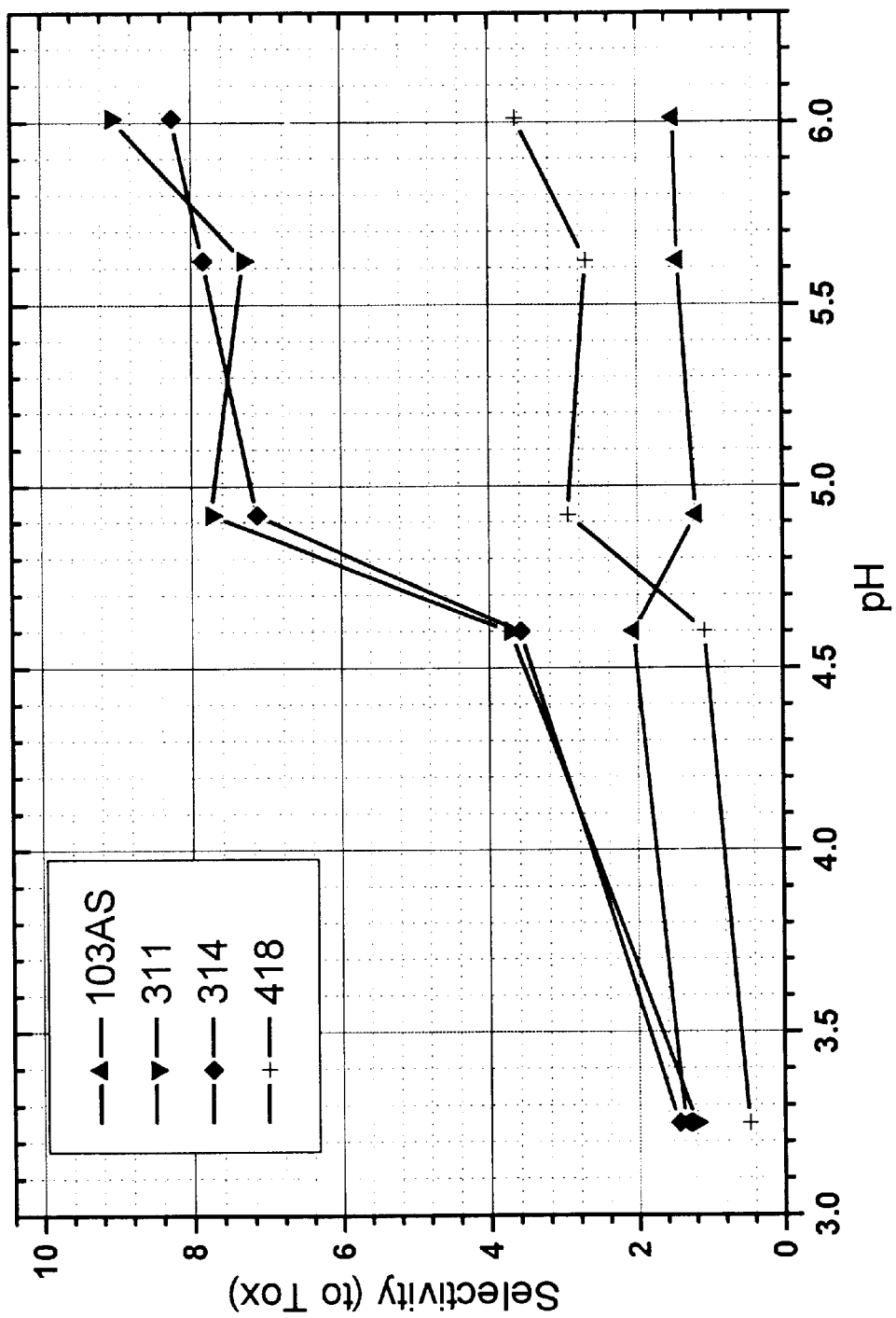
FIG. 5 shown selectivity of zirconium oxide slurry (TMAH) applied on SOG low dielectric insulating layers.

The present invention relates to new slurry formulation for CMP, which comprises: (a) metal oxide of 2.0–10 wt % and can be chosen from zirconium oxide, cerium oxide, aluminium oxide, or their combinations;

(b) buffer solution which consists of a strong acid and a weak base. The strong acid can be chosen from nitric acid, hydrochloric acid, sulphuric acid, phosphoric acid, or their combinations. The weak base can be organic ammonium hydroxide with structure formula $R_1R_2R_3R_4NOH$, where radical $R_1$, $R_2$, $R_3$, and $R_4$ can be any alkyls with carbn number ranging from 1–8.

The slurry formulation has the advantage of high polish rate and can be applied on silica, silica thin layer, and organic added silica insulating layer in CMP planarization.

The slurry formulation in the present invention comprises metal oxide powder, which doesn't dissolve in acid, base, or water, as well as the buffer solution. The metal oxide weights 5–40% and can be chosen from aluminium oxide, cerium oxide, and zirconium oxide. The buffer solution consists of a strong acid and a weak base. The strong acid can be chosen from hydrochloric acid, sulphuric acid, phosphoric acid, and nitric acid. But phosphoric acid and nitric acid are better choices. The weak base in the present invention can be organic ammonium hydroxide with structure formula $R_1R_2R_3R_4NOH$, where radical $R_1$, $R_2$, $R_3$, and $R_4$ can be any alkyls with carbon number ranging from 1–8. A better result can be obtained when $R_1$, $R_2$, $R_3$, $R_4$ are the same alkyls with carbon number ranging from 1–6.

The polish rate of the slurry formulation in the present invention is twenty times that of the traditional silica-based slurry. Especially when applied on organic insulating layers, the slurry formulation in the present invention can have polish rate as high as 2000–4000 Å/min while the silica-based slurry can only have 100–200 Å/min.

To further demonstrate the advantage of the present invention, commercial slurry, in which silica weights 10% and pH=10.2–10.35 (model number: Cabot SC-1, see attachment 2 for detail information), and the slurry in the present invention are applied or both organic spin-on glass layer with the organic content varied from 11%, 14%, and 0%, and thermal oxide. The results reveal that the slurry in the present invention has great polish rate and uniformity on organic SOG layers.

Properties and the contents of the organic SOG layers used in the test

|  | 103AS | 111 | 311 | 314 | 418 |
|---|---|---|---|---|---|
| organic content (%) | 0 | 10 | 10 | 10 | 22 |
| water (%) | 5.8 | 10.5 | 7.7 | 4.5 | 0 |
| dielectric constant | 6–8 | 3.8 | 3.8 | 3.8 | 2.7 |
| refraction constant | 1.43 | 1.39 | 1.39 | 1.38 | 1.36 |

-continued

| | 103AS | 111 | 311 | 314 | 418 |
|---|---|---|---|---|---|
| selectivity (SOG/thermal oxide) | 4.5 | 12 | 12 | 36 | — |
| disilane/water material | high silicate | low methyl-silicate | low methyl-silicate | Low methyl-silicate | little methyl-silsesquloxane |

The thickness of the dielectric insulating layer is measured by optical interference profiler (Nanometrics, model 2100XP). Measurements are made on nine test points where 1 cm from the edge is excluded. The following values are obtained:

t: polish time $\Delta_T$: maximum polish thickness $\Delta_M$: minimum polish thickness CMPA: thickness before CMP polish CMPB: thickness after CMP polish R: thermal oxide polish rate/SOG polish rate $\Delta_s$: average polish thickness where $$\Delta_S = \sum_{i=1}^{9} [(CMFA)_i - (CMFB)_i]/9$$

polish rate=$\Delta_s$/t thickness variation $$(\%) = \frac{\Delta_T - \Delta_M}{2 \times \Delta_S} \times 100\%$$

preparation of the SOG insulating layer

Commercial Silicates: 103AS, 111 (or 311), 314, and 418 from Allied Signal's are used as starting material on a 6' wafer.

The spinner is made by Tokyo Ohka Kogyo Co. Ltd. with rotation speed 2400 rpm. In order to remove the solvent in the layer, soft bake was conducted at 80° C., 150° C., and 220° C. respectively for 1 minute. Solidation was done by subsequent hard baking at 340° C., 370° C., and 415° C. in nitrogen environment for 70 to 90 minutes.

Comparsion A

Results of commercial Cabot SC-1 applied on SOG low dielectric insulating layers and thermal oxide Polishing platform: Westech, model 372M (Polishing gasket and bearing-head gasket): Rodel®, IC1400, DF-200

Cabot SC1: silica content~10%, pH=10.2–10.35 polishing parameters:

pressure: 5 psi polishing platform speed: 20 rpm heat speed: 25 rpm flow rate: 150 mL/min

| specimen | organic content | polish rate | non-uniformity | selectivity |
|---|---|---|---|---|
| 111 | 11 | 142 | 14.83 | 0.26 |
| 314 | 14 | 146 | 17.82 | 0.26 |
| 103AS | 0 | 622 | 12.72 | 1.13 |
| thermal oxide | 0 | 522 | 15.37 | 1 |

Due to the low polish rate and the low selectivity, commercial cabot SC-1 silica slurry is not appropriate for CMP of organic SOG layers.

Embodiment B

Results of zirconium oxide slurry (TMAH) applied on SOG low dielectric insulating layers and thermal oxide Polishing platform: Westech, model 372M (Polishing gasket and bearing-head gasket): Rodel™, IC1400, DF-200 zirconium oxide slurry formulation: zirconium oxide content 1000 ml~2%, 0.1~0.4 m mol tetra-methyl ammonium hydroxide, and nitric acid for acidity control organic content: 11%, 14%, and 0% polishing parameters:

pressure: 5 psi polishing platform speed: 20 rpm head speed: 25 rpm flow rate: 150 mL/min For specimen without organic compounds, like silicate 103As and thermal oxide, polish is less effective. For other specimen, like 111 and 314, the polish rate is dramatically increased and the selectivity for thermal oxide is also high.

| Specimen | Organic content | tmah pH | polish rate | non-uniformity | selectivity |
|---|---|---|---|---|---|
| 111 | 11 | 4.28 | 2181 | 23.66 | 1.62 |
| | | 4.51 | 2152 | 16.97 | 1.31 |
| | | 5.06 | 2473 | 17.57 | 1.58 |
| | | 5.54 | 2814 | 16.14 | 2.58 |
| | | 6.05 | 2792 | 14.60 | 6.03 |
| 314 | 14 | 4.28 | 2722 | 18.07 | 2.02 |
| | | 4.51 | 3055 | 17.37 | 1.87 |
| | | 5.06 | 3171 | 13.30 | 2.03 |
| | | 5.54 | 3286 | 12.93 | 3.01 |
| | | 6.05 | 3335 | 13.55 | 7.20 |
| 103AS | 0 | 4.28 | 919 | 9.64 | 0.68 |
| | | 4.51 | 642 | 12.98 | 0.39 |
| | | 5.06 | 565 | 9.19 | 0.36 |
| | | 5.54 | 430 | 12.46 | 0.39 |
| | | 6.05 | 476 | 26.21 | 1.03 |
| thermal oxide | 0 | 4.28 | 1347 | 7.5 | 1 |
| | | 4.51 | 1638 | 7.93 | 1 |
| | | 5.06 | 1562 | 9.54 | 1 |
| | | 5.54 | 1090 | 11.55 | 1 |
| | | 6.05 | 463 | 15.56 | 1 |

Embodiment C

Results of zirconium oxide slurry (TMAH) applied on SOG low dielectric insulating layers and thermal oxide Polishing platform: Westech, model 372M (Polishing gasket and bearing-head gasket): Rodel™, IC1400, DF-200 zirconium oxide slurry formulation: zirconium oxide content 1000 ml~2%, 0.1~0.4 m mol tetra-methyl ammonium hydroxide, and nitric acid for acidity control polishing parameters:

pressure 5 psi polishing platform speed: 20 rpm head speed: 25 rpm flow rate: 150 mL/min

| Specimen | organic content | tmah pH | polish rate | non-uniformity | selectivity |
|---|---|---|---|---|---|
| 111 | 11 | 3.25 | 2657 | 20.67 | 1.21 |
| | | 4.60 | 3949 | 9.76 | 3.72 |
| | | 4.97 | 3974 | 8.80 | 7.75 |
| | | 562 | 3910 | 7.22 | 7.32 |
| | | 6.01 | 4173 | 9.28 | 9.05 |

-continued

| Specimen | organic content | tmah pH | polish rate | non-uniformity | selectivity |
|---|---|---|---|---|---|
| 314 | 14 | 3.25 | 3176 | 13.63 | 1.45 |
|  |  | 4.60 | 3806 | 6.86 | 3.59 |
|  |  | 4.97 | 3669 | 6.93 | 7.15 |
|  |  | 5.62 | 4193 | 10.02 | 7.85 |
|  |  | 6.01 | 3807 | 8.93 | 8.26 |
| 103AS | 0 | 3.25 | 2977 | 5.69 | 1.36 |
|  |  | 4.60 | 2190 | 14 | 2.06 |
|  |  | 4.97 | 604 | 32.44 | 1.18 |
|  |  | 5.62 | 762 | 24.2 | 1.43 |
|  |  | 6.01 | 683 | 24.81 | 1.48 |
| thermal oxide | 0 | 3.25 | 2191 | 6.47 | 1 |
|  |  | 4.60 | 1061 | 15.07 | 1 |
|  |  | 4.97 | 513 | 11.71 | 1 |
|  |  | 5.62 | 534 | 5.55 | 1 |
|  |  | 6.01 | 461 | 14.62 | 1 |

For specimen without organic compounds, like silicate 103As and thermal oxide, polish is less effective. For other specimens, like 111 and 314, the polish rate is dramatically increased and the selectivity is also high.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. Slurry formulation for CMP comprises:
   (a) metal oxide which weights 2.0–10% and can be chosen from zirconium oxide, cerium oxide, aluminum oxide, or their combinations;
   (b) buffer solution which consists of a strong acid and a weak base, where the strong acid can be chosen from nitric acid, hydrochloric acid, sulphuric acid, phosphoric acid, or their combinations; the weak base can be organic ammonium hydroxide with structure formula $R_1R_2R_3R_4NOH$ where radical $R_1R_2$, $R_3$, and $R_4$ can be any alkyls with carbon number ranging from 1–8.

2. The slurry formulation of claim 1, where the metal oxide is zirconium oxide.

3. The slurry formulation of claim 1, wherein the strong acid is phosphoric acid.

4. The slurry formulation of claim 1, wherein the strong acid is nitric acid.

5. The slurry formulation of claim 1, where radical $R_1$, $R_2$, $R_3$, and $R_4$ are the same alkyls.

6. The slurry formulation of claim 5, where radical $R_1$, $R_2$, $R_3$, $R_4$ are methyls.

7. The slurry formulation of claim 5, where radical $R_1$, $R_2$, $R_3$, and $R_4$ are tetra-alkyls.

8. The slurry formulation of claim 1, where the acidity lies between pH 2–6.5.

9. The slurry formulation of claim 8, where the acidity lies between pH 3–6.5.

* * * * *